United States Patent [19]
Durham et al.

[11] Patent Number: 5,566,130
[45] Date of Patent: Oct. 15, 1996

[54] ADDRESS TRANSITION DETECTION (ATD) CIRCUIT FOR ASYNCHRONOUS VLSI CHIPS

[75] Inventors: Christopher M. Durham, Austin; Michael K. Ciraula, Round Rock; Craig L. Stephen, Austin, all of Tex.

[73] Assignee: The United States of America as represented by the Secretary of the Air Force, Washington, D.C.

[21] Appl. No.: 555,601

[22] Filed: Nov. 9, 1995

[51] Int. Cl.⁶ .................................................. G11C 8/00
[52] U.S. Cl. ........................ 365/233.5; 365/194; 327/14
[58] Field of Search ........................... 365/233, 233.5, 365/194; 327/143, 175, 227, 14, 18, 31, 35, 400

[56] References Cited

U.S. PATENT DOCUMENTS

| | | | |
|---|---|---|---|
| 5,159,574 | 10/1992 | Kim et al. | 365/233.5 |
| 5,267,216 | 11/1993 | Gabillard et al. | 365/233.5 |
| 5,306,958 | 4/1994 | Reddy et al. | 307/265 |
| 5,306,963 | 4/1994 | Leak et al. | 365/233.5 |
| 5,343,082 | 8/1994 | Han et al. | 307/234 |
| 5,428,580 | 6/1995 | Kawashima et al. | 365/233.5 |
| 5,448,529 | 9/1995 | Reddy et al. | 365/233.5 |
| 5,493,538 | 2/1996 | Bergman | 365/233.5 |

*Primary Examiner*—Son Dinh
*Attorney, Agent, or Firm*—William G. Auton

[57] ABSTRACT

A logic filtered address transition detection circuit that receives a chip select signal and an ATD pulse, and which produces an internal clock pulse using:

an AND gate, a filtered input terminal, a delay unit and a comparator unit. The AND gate outputs an AND logic signal after processing the chip select signal and ATD pulse, the filtered input terminal and delay unit both receive the AND logic signal from the AND gate; and send their signals to the comparator unit. The comparator unit performs a logic function on the AND logic signal and a delayed AND logic signal to produce the internal clock signal.

14 Claims, 1 Drawing Sheet

5,566,130

ADDRESS TRANSITION DETECTION (ATD) CIRCUIT FOR ASYNCHRONOUS VLSI CHIPS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to asynchronous semiconductor devices, and more specifically the invention pertains to an address transition detection circuit. Asynchronous devices require internal clock generator circuits in most cases. One prevalent method of generating the internal clock signals is Address Transition Detection (ATD), which is especially prominent in Static Random Access Memories (SRAMs). An ATD circuit creates an output pulse, or clock signal, when the input signal changes logic state. The clock signal is then used to time the internal operation. This operation differs from a synchronous device since the clock signal is generated by internal circuitry rather then provided by external circuitry.

The task of providing an ADT device to generate an internal clocking pulse for asynchronous devices is alleviated, to some extent, by the systems disclosed in the following U.S. Patents, the disclosures of which are incorporated herein by reference:

U.S. Pat. No. 5,448,529 issued to Reddy;
U.S. Pat. No. 5,428,580 issued to Kawashima;
U.S. Pat. No. 5,343,082 issued to Han;
U.S. Pat. No. 5,306,958 issued to Reddy;
U.S. Pat. No. 5,267,216 issued to Gabillard; and
U.S. Pat. No. 5,159,574 issued to Kim.

The above-cited patents use ATD clock generators that can be improved by the present invention.

SUMMARY OF THE INVENTION

Many asynchronous devices use Address Transition Detection (ATD) to generate an internal clocking pulse. However, most approaches do not provide for the chip de-selected situation; that is, the ATD operation during the de-selected state is not considered. The circuit described herein provides a new ATD pulse generator that automatically turns "on" during de-select and, in addition, does not turn "off" after the chip is re-selected until the normal, present time has expired.

One embodiment of the invention is a logic filtered address transition detection circuit that receives a chip select signal and an ATD pulse, and which produces an internal clock pulse using:

an AND gate, a filtered input terminal, a delay unit and a comparator unit. The AND gate outputs an AND logic signal after processing the chip select signal and ATD pulse, the filtered input terminal and delay unit both receive the AND logic signal from the AND gate; and send their signals to the comparator unit. The comparator unit performs a logic function on the AND logic signal and a delayed AND logic signal to produce the internal clock signal.

It is an object of the present invention to provide an address transition detection circuit that is immune to the possibility of misinterpreting the "turn on" and "turn off" of electrical power as logic input signals.

It is another object of the invention to provide an improved internal clock generator.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an address transition detection circuit that receives a chip select signal and an ATD pulse, and which produces an internal clock pulse using:

an AND gate, a filtered input terminal, a delay unit and a comparator unit.

Figure 1:
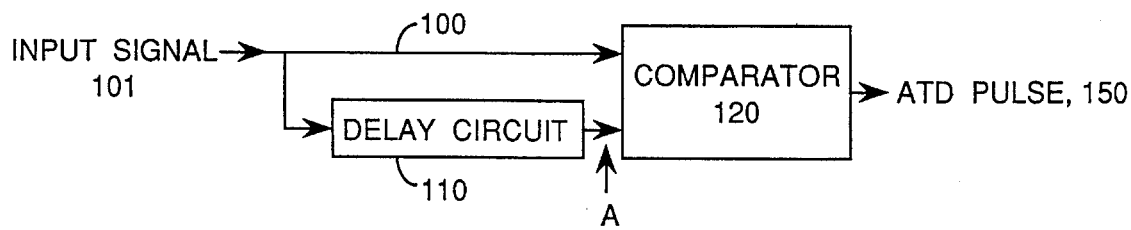
FIG. 1 is a block diagram of a prior art ATD circuit.

In order to understand the improvement provided by the inventor, the reader's attention is now directed towards FIG. 1 which illustrates a prior art ATD circuit.

There are many techniques used to construct and ATD circuit, each selected by the designer to fit situational needs. However, almost without exception, each circuit depends on a delay path to slow down a signal in parallel with a normal path. The delayed and normal signals are then compared to generate a pulse while they differ. This approach can be seen in FIG. 1.

The system of FIG. 1 produces an ATD clocking pulse 150 from an input signal 101 using: an input terminal 100, a delay circuit 110 and a comparator unit 120. The input terminal 100 can include a power divider that splits the input signal 101 between the comparator 120 and the delay circuit 110. The delay circuit 110 delays the input signal for a preselected period of time, and the comparator outputs an ATD clocking pulse as a logic function between the input signal and the delayed input signal seen at node A of FIG. 1.

Figure 2:
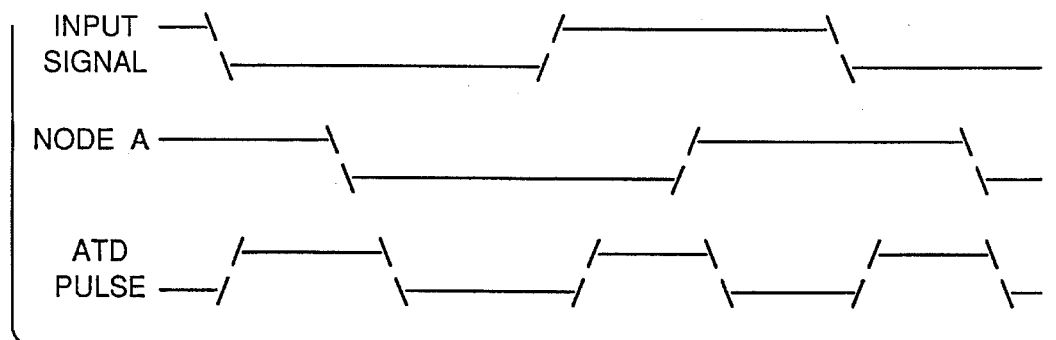
FIG. 2 is a chart of some of the signals in the system of FIG. 1.

FIG. 2 is a time chart that forms and ATD pulse timing diagram between:

the input signal 101, the delayed input signal produced by the delay circuit at mode A, and the ATD clocking pulse 150 produced by the comparator unit 120 of FIG. 1. The comparator unit 120 is a logic gate which has a logic function that is preselected and which depends upon the type of clocking signal desired. In FIGS. 1 and 2, when the delayed input is in the same state as the input signal; the output of the ADT circuits rests in the "off" state.

Figure 3:
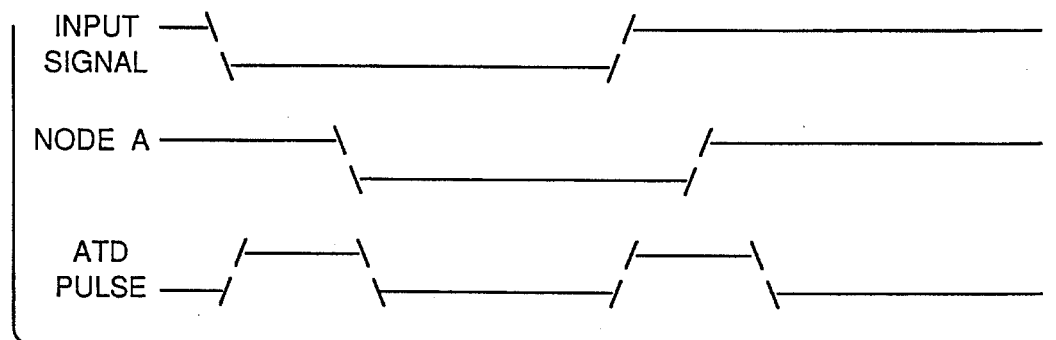
FIG. 3 is a chart of the power up time diagram.

When the input signal changes, the signal at node A will remain at the previous state until the incoming signal propagates through the delay circuit. The comparator circuit changes logic state to the "on" state while the signal at node A differs from the input signal. After the signal propagates through the delay circuit, the inputs to the comparator are now equal and the ATD output returns to the "off" state. The output remains in the "off" state until the input signal changes state again. In this way, the ATD circuit creates a clock pulse as shown in the timing diagram of FIG. 2. However, the approach of FIG. 1 does not take into account the powered-down or de-selected state. During this operation, the chip transitions into a lower power, standby state (via one or more chip select input signals), bringing the address outputs to an "off" state. Thus, the ATD circuit will generate a pulse, since the input signal has changed. After the chip is re-selected, the input to the ATD changes again, and another pulse is generated. This is shown in FIG. 3.

In many cases, the ATD pulse is used to force the device temporarily into the standby mode during access (such is the case on the IBM 64K and 256K Radiation Hardened Static RAMs). When this is the case, it is advantageous to activate the ATD pulse during the standby mode of operation. In order to perform this function in existing hardware, an additional AND function must be added as shown in FIG. 4.

Figure 4:
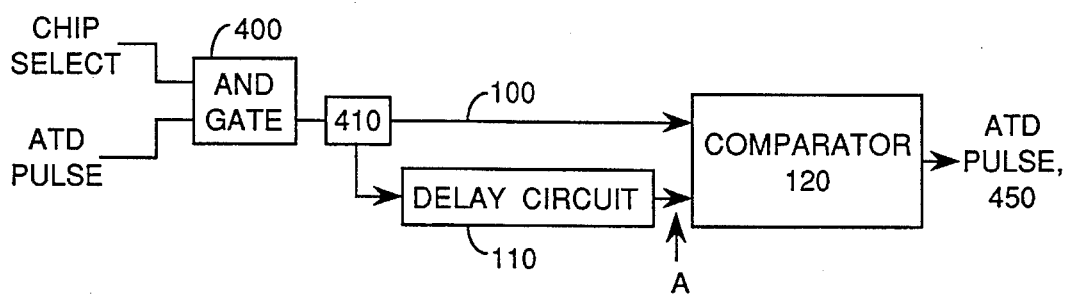
FIG. 4 is a block diagram of the present diagram.

The system of FIG. 4 is a logic filtered address transition detection circuit that receives a chip select signal and an ATD pulse, and which produces an internal clock pulse using:

an AND gate 400, a filtered input terminal 100, power divider 410, a delay unit 110 and a comparator unit 120. The AND gate 400 outputs an AND logic signal after processing the chip select signal and ATD pulse, the filtered input terminal and delay unit both receive the AND logic signal from the AND gate; and send their signals to the comparator unit 120. The comparator unit 120 performs a logic function on the AND logic signal and a delayed AND logic signal to produce the internal clock signal 450.

The present invention will provide an address transition detection circuit that is immune to the possibility of misinterpreting the "turn on" and "turn off" of electrical power as logic input signals.

The comparator used in the present invention is selected from a group consisting of: AND gates, OR gates, NAND gates and NOR gates. The delay circuit has a delay interval that is preselected by the user and which is used along with the logic function of the comparator to determine the duration of the clock pulse signal. While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A logic filtered address transition detection circuit which receives a chip select signal and an input signal, and which produces a clock pulse signal, said logic filtered address transition detection circuit comprising:

a means for filtering input signals from power supply phenomena, said filtering means filtering said chip select signal and said input signal to output a logic filtered input signal;

a means for splitting said logic filtered input signal from said filtering means into a first and second logic filtered input signal;

a means for delaying the second logic filtered input signal from said splitting means to produce a delayed second logic filtered input signal; and a means for producing clock signals that represent a logical comparison between the first logic filtered input signal from said splitting means and the delayed second logic filtered input signal from said delaying means, said producing means producing said clock pulse signal thereby.

2. A logic filtered address transition detection circuit, as defined in claim 1, wherein said filtering means comprises an AND gate which produces said logic filtered input signal by processing said chip select signal and said input signal.

3. A logic filtered address transition detection circuit, as defined in claim 1, wherein said splitting means comprises a power divider that produces said first and second logic filtered input signals by processing the logic filtered input signal from said filtering means.

4. A logic filtered address transition detection circuit, as defined in claim 2, wherein said splitting means comprises a power divider that produces said first and second logic filtered input signals by processing the logic filtered input signal from said filtering means.

5. A logic filtered address transition detection circuit, as defined in claim 1, wherein said producing means comprises a logic comparator circuit selected from a group consisting of: AND gates, OR gates, NAND gates, and NOR gates.

6. A logic filtered address transition detection circuit, as defined in claim 2, wherein said producing means comprises a logic comparator circuit selected from a group consisting of: AND gates, OR gates, NAND gates, and NOR gates.

7. A logic filtered address transition detection circuit, as defined in claim 3, wherein said producing means comprises a logic comparator circuit selected from a group consisting of: AND gates, OR gates, NAND gates, and NOR gates.

8. A logic filtered address transition detection circuit, as defined in claim 4, wherein said producing means comprises a logic comparator circuit selected from a group consisting of: AND gates, OR gates, NAND gates, and NOR gates.

9. A logic filtered address transition detection circuit, as defined in claim 1, wherein said delaying means comprises a delay unit that has a preselected delay interval that is used along with a logic function of the producing means to determine a duration of the clock pulse signal.

10. A logic filtered address transition detection circuit, as defined in claim 2, wherein said delaying means comprises a delay unit that has a preselected delay interval that is used along with a logic function of the producing means to determine a duration of the clock pulse signal.

11. A logic filtered address transition detection circuit, as defined in claim 5, wherein said delaying means comprises a delay unit that has a preselected delay interval that is used along with a logic function of the producing means to determine a duration of the clock pulse signal.

12. A logic filtered address transition detection circuit, as defined in claim 6, wherein said delaying means comprises a delay unit that has a preselected delay interval that is used along with a logic function of the producing means to determine a duration of the clock pulse signal.

13. A logic filtered address transition detection circuit, as defined in claim 7, wherein said delaying means comprises a delay unit that has a preselected delay interval that is used along with a logic function of the producing means to determine a duration of the clock pulse signal.

14. A logic filtered address transition detection circuit, as defined in claim 8, wherein said delaying means comprises a delay unit that has a preselected delay interval that is used along with a logic function of the producing means to determine a duration of the clock pulse signal.

* * * * *